US010562069B2

United States Patent
Horsley et al.

(10) Patent No.: US 10,562,069 B2
(45) Date of Patent: Feb. 18, 2020

(54) PIEZOELECTRIC MICROMACHINED ULTRASONIC TRANSDUCERS USING TWO BONDED SUBSTRATES

(71) Applicants: David A. Horsley, Albany, CA (US); Andre Guedes, Lisbon (PT); Meng-Hsiung Kiang, Albany, CA (US); Richard J. Przybyla, Emeryville, CA (US); Stefon Shelton, Oakland, CA (US)

(72) Inventors: David A. Horsley, Albany, CA (US); Andre Guedes, Lisbon (PT); Meng-Hsiung Kiang, Albany, CA (US); Richard J. Przybyla, Emeryville, CA (US); Stefon Shelton, Oakland, CA (US)

(73) Assignee: CHIRP MICROSYSTEMS, INC., Berkeley, CA (US)

( * ) Notice: Subject to any disclaimer, the term of this patent is extended or adjusted under 35 U.S.C. 154(b) by 451 days.

(21) Appl. No.: 15/405,876

(22) Filed: Jan. 13, 2017

(65) Prior Publication Data
US 2017/0128983 A1    May 11, 2017

Related U.S. Application Data

(63) Continuation of application No. PCT/US2015/040603, filed on Jul. 15, 2015.

(60) Provisional application No. 62/025,466, filed on Jul. 16, 2014.

(51) Int. Cl.
*B06B 1/06* (2006.01)
*H01L 41/053* (2006.01)
*H01L 41/18* (2006.01)
*H01L 41/277* (2013.01)

(52) U.S. Cl.
CPC .......... *B06B 1/0622* (2013.01); *H01L 41/053* (2013.01); *H01L 41/18* (2013.01); *H01L 41/277* (2013.01)

(58) Field of Classification Search
CPC combination set(s) only.
See application file for complete search history.

(56) References Cited

U.S. PATENT DOCUMENTS

| 4,556,812 | A | 12/1985 | Kline et al. |
|---|---|---|---|
| 2005/0205951 | A1 | 9/2005 | Eskridge |
| 2006/0012020 | A1 | 1/2006 | Gilleo |
| 2010/0327695 | A1 | 12/2010 | Goel et al. |
| 2011/0074248 | A1* | 3/2011 | Hishinuma ............... H01G 5/16 310/330 |

(Continued)

OTHER PUBLICATIONS

Co-Pending U.S. Appl. No. 62/025,466 to David Horsley, filed Jul. 16, 2014.

(Continued)

*Primary Examiner* — Bryan P Gordon
(74) *Attorney, Agent, or Firm* — JDI Patent; Joshua D. Isenberg; Robert Pullman

(57) ABSTRACT

A piezoelectric micromachined ultrasound transducer (PMUT) is disclosed. The PMUT consists of a flexural membrane that is piezoelectrically actuated. These membranes are formed on a first substrate that is bonded to a second substrate. The two substrates are separated by an air gap to allow the PMUT to vibrate. Several methods for joining the two substrates are described.

41 Claims, 5 Drawing Sheets

(56) References Cited

U.S. PATENT DOCUMENTS

| | | | |
|---|---|---|---|
| 2012/0146458 A1 | 6/2012 | Chang et al. | |
| 2012/0280594 A1 | 11/2012 | Chen et al. | |
| 2012/0319535 A1* | 12/2012 | Dausch | B06B 1/0622 |
| | | | 310/365 |
| 2013/0051179 A1* | 2/2013 | Hong | H01L 23/481 |
| | | | 367/140 |
| 2013/0270967 A1* | 10/2013 | Dausch | B06B 1/0607 |
| | | | 310/365 |
| 2013/0294201 A1* | 11/2013 | Hajati | H01L 41/047 |
| | | | 367/138 |
| 2015/0097468 A1* | 4/2015 | Hajati | H01L 41/0825 |
| | | | 310/334 |
| 2015/0137285 A1* | 5/2015 | Shim | B81B 7/007 |
| | | | 257/416 |

OTHER PUBLICATIONS

S. Shelton, et al, "CMOS-compatible AlN piezoelectric micromachined ultrasonic transducers," 2009 IEEE International Ultrasonics Symposium, pp. 402-405, Rome, Italy, Sep. 20-32, 2009.

S. Shelton, O. Rozen, A. Guedes, R. Przybyla, B. Boser, and D. A. Horsley, "Improved acoustic coupling of air-coupled micromachined ultrasonic transducers," 27th IEEE International Conference on Micro Electro Mechanical Systems (MEMS 2014), pp. 753-756, San Francisco, CA 2014.

* cited by examiner

PIEZOELECTRIC MICROMACHINED ULTRASONIC TRANSDUCERS USING TWO BONDED SUBSTRATES

CLAIM OF PRIORITY

This application is a continuation of International Patent Application Number PCT/US2015/040603, filed Jul. 15, 2016, the entire disclosures of which are incorporated herein by reference. International Patent Application Number PCT/US 2015/040603 claims the priority benefit of U.S. Provisional Patent Application No. 62/025,466, filed Jul. 16, 2014, the entire disclosures of which are incorporated by reference.

STATEMENT REGARDING FEDERALLY SPONSORED RESEARCH OR DEVELOPMENT

This invention was made with Government support under IIP-1346158 awarded by the National Science Foundation. The Government has certain rights in this invention. 45 CFR 650.4(f)(4)

NOTICE OF MATERIAL SUBJECT TO COPYRIGHT PROTECTION

A portion of the material in this patent document is subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. § 1.14.

BACKGROUND OF THE INVENTION

Piezoelectric micromachined ultrasonic transducers (PMUTs) have been described in several earlier publications, including S. Shelton, et al, "CMOS-compatible AlN piezoelectric micromachined ultrasonic transducers," 2009 IEEE International Ultrasonics Symposium, pp. 402-405, Rome, Italy, Sep. 20-32, 2009, incorporated by reference herein in its entirety. A typical PMUT is a multilayer membrane structure that is excited into flexural vibration using piezoelectric actuation. The membrane structure is often formed by etching through a silicon wafer to remove the material beneath the membrane, thereby allowing it to vibrate. This etch forms a hollow tube beneath the back-side of the membrane. Sound is emitted from the tube when the membrane vibrates and the tube may be designed as an acoustic resonator to improve acoustic performance of the PMUT, as described in S. Shelton, O. Rozen, A. Guedes, R. Przybyla, B. Boser, and D. A. Horsley, "Improved acoustic coupling of air-coupled micromachined ultrasonic transducers," 27th IEEE International Conference on Micro Electro Mechanical Systems (MEMS 2014), pp. 753-756, San Francisco, Calif. 2014, incorporated by reference herein in its entirety. Packaging the PMUT chip is challenging for a number of reasons. First, the front side of the membrane must be free to vibrate and cannot be contacted or coated by another material. Second, sound emitted from the front side of the membrane will reflect off surfaces facing the membrane; these reflections must be controlled to avoid reducing the acoustic output from the tube on the membrane back side. Third, the wafer is often thinned before etching the acoustic tube. As a result, the final die is thin and perforated with an array of holes, increasing the sensitivity to packaging stress and increasing cross-talk between neighboring PMUTs on the die.

In U.S. Pat. Nos. 7,449,821 and 8,710,717, Dausch describes PMUT devices composed of a first PMUT substrate bonded to a second redistribution or IC substrate. In both devices, the bottom side of the PMUT substrate is bonded to the top of the IC substrate. Many complicated fabrication steps are required to realize through-wafer vias that connect the front-side PMUTs to the back-side electrical contacts. Moreover, the vibrating PMUTs are relatively far from the bonded interface, resulting in increased mechanical coupling between PMUTs (a problem that Dausch tries to address by adding an additional polymer isolation layer between PMUTs).

Accordingly, what is needed is a PMUT design and fabrication method that would overcome the above-identified issues. The design and the fabrication method should be easy to implement, cost-effective, and utilize existing chip and wafer assembly technology. It is within this context that aspects of the present disclosure arise.

BRIEF SUMMARY OF THE INVENTION

This invention generally relates to micromachined ultrasonic transducers (MUTs) and more particularly to a design for a piezoelectric micromachined ultrasonic transducer (PMUT) device and a method to fabricate this device. The device consists of two substrates that are bonded together using either a conductive metallic bond or solder balls. The first substrate contains one or more PMUTs and the second substrate has either metallic interconnect or CMOS circuitry. The substrates are bonded such that the metallized top surface of the PMUT array faces the second substrate and sound emanates from tubes etched through the back side of the PMUT substrate. The approach is simple, requiring no through-silicon vias. The mechanical rigidity of the device is improved, reducing mechanical cross-talk between neighboring PMUTs. The acoustic performance is enhanced, since the tube(s) can be designed to increase the acoustic output pressure and the gap between the two substrates can be designed to have desirable acoustic properties.

BRIEF DESCRIPTION OF THE SEVERAL VIEWS OF THE DRAWING(S)

Aspects of the present disclosure will be more fully understood by reference to the following drawings which are for illustrative purposes only:

DETAILED DESCRIPTION OF THE INVENTION

Although the description herein contains many details, these should not be construed as limiting the scope of the invention but as merely providing illustrations of some of the presently preferred embodiments of this invention. Therefore, it will be appreciated that the scope of the present invention fully encompasses other embodiments which may become obvious to those skilled in the art.

According to aspects of the present disclosure a piezoelectric micromachined ultrasonic transducer (PMUT) device may include two substrates that are bonded together. It will be appreciated that the following embodiments are provided by way of example only, and that numerous variations and modifications are possible. For example, while circular embodiments are shown, the PMUT may have many different shapes such as square, rectangular, hexagonal, octagonal, and so on. Furthermore, while PMUTs are shown having a unimorph construction, consisting of a single piezoelectric layer on a passive layer, bimorph and multimorph PMUTs having multiple piezoelectric layers and various electrode patterns are possible. All such variations that would be apparent to one of ordinary skill in the art are intended to fall within the scope of this disclosure. It will also be appreciated that the drawings are not necessarily to scale, with emphasis being instead on the distinguishing features of the bonded wafer PMUT device disclosed herein.

Figure 1:
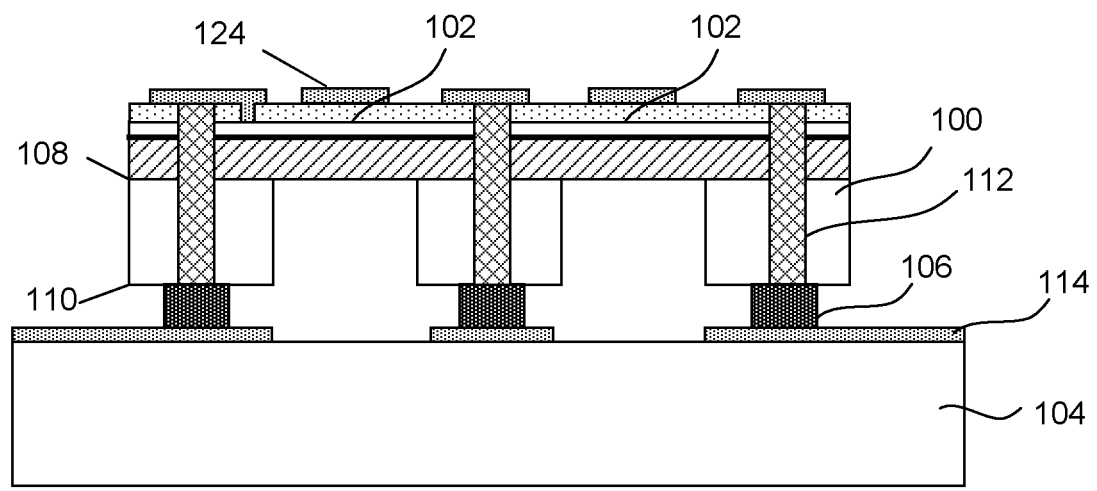
FIG. 1 is a cross section view of a prior art piezoelectric micromachined ultrasonic transducer.

FIG. 1 is a cross-section illustration of a prior art PMUT formed from two substrates that are bonded together. A first substrate 100 contains one or more PMUTs 102 which are formed from multiple thin-film layers formed, e.g., deposited or bonded, onto the substrate 100. The multiple thin-film layers typically include electrodes 124, which may be formed by patterning one or more conductive layers that form the PMUTs 102. The first substrate 100 is bonded to a second substrate 104 using conductive bonding layer 106 that provides both a mechanical connection between the two substrates and an electrical connection between the electrodes 124 on the first substrate 100 and corresponding electrical interconnects 114 on the second substrate 104. Because the PMUTs 102 are located on the front side 108 of substrate 100 while conductive bonding layer 106 is located on the back side 110 of substrate 100, conductive connections 112 through the first substrate 100, for example through-silicon vias (TSVs), are needed to provide electrical connection between the PMUTs 102 and electrical interconnect layer 114 on the second substrate 104.

Figure 2A:
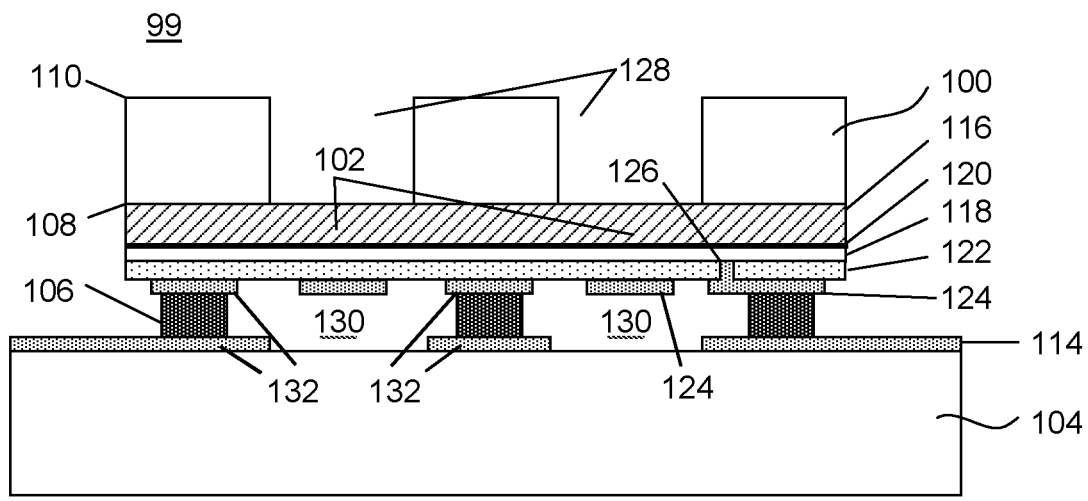
FIG. 2A is a cross section view of a piezoelectric micromachined ultrasonic transducer in accordance with an aspect of the present disclosure.
Figure 2B:
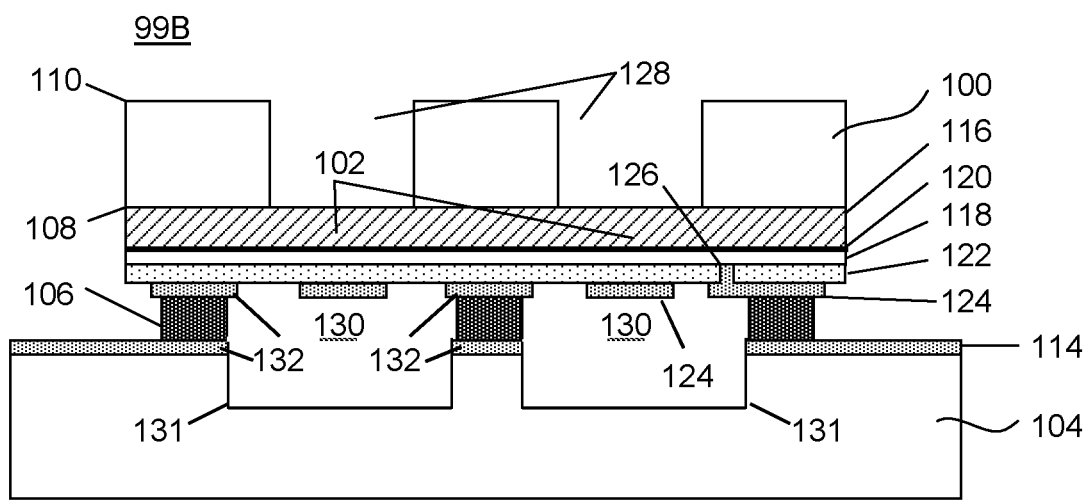
FIG. 2B is a cross section view of an alternative piezoelectric micromachined ultrasonic transducer in accordance with an aspect of the present disclosure.

FIGS. 2A-2B show cross-section illustrations of PMUT arrays 99, 99B in accordance with aspects of the present disclosure. A first substrate 100 contains one or more PMUTs 102, which may be formed from multiple thin-film layers deposited or bonded onto the front side 108 of the first substrate 100. The PMUTs 102 include electrodes 124. The first substrate 100 is bonded with its front side 108 facing a second substrate 104 such that the back side 110 of substrate 100 is exposed. Because the conductive bonding layer 106 and the PMUTs 102 are both on the front side 108 of substrate 100, no through-wafer connections are needed to provide electrical connection between the bonding layer 106 and the electrodes 124 of the PMUTs 102.

When the PMUTs 102 are excited into vibration, ultrasound is emitted from tubes 128 on the back side 110 of substrate 100. The thickness of substrate 100 may be determined such that an acoustic resonance frequency of the tubes 128 matches a mechanical resonance frequency of vibration of the PMUTs 102, thereby enhancing the acoustic performance of the PMUT array 99. The two substrates 100 and 104 may be bonded such that a gap 130 remains between the two wafers. The thickness of the gap may be sufficient to allow the PMUTs 102 room to vibrate without introducing significant squeeze-film damping, e.g., sufficiently large relative to the vibrating parts of the PMUTs 102. The thickness of the gap 130 may also be designed such that acoustic resonances within gap 130 formed between the first substrate 100 and the second substrate 104 do not significantly reduce the sound pressure output from the PMUTs, e.g., through the tubes 128.

Both squeeze film effects and resonance effects may be taken into account in selecting the thickness of the gap 130. At sufficiently small gap thickness (below e.g., about 10 microns) acoustic energy is lost by compressing the air film in the gap. This type of loss of acoustic energy is known as squeeze-film damping. Acoustic resonances resulting from sound reflections in the gap 130 can degrade the frequency response of the PMUTs 102 by creating nulls where the output sound pressure level (SPL) is much lower (e.g., by about 10 dB or more) than desired.

The first substrate 100 may be made of silicon but alternative materials such as glass, ceramic, or polymer substrates may be used. By way of example, and not by way of limitation, in the unimorph PMUT construction illustrated in FIG. 2A and FIG. 2B, a passive layer 116 may be first deposited onto the substrate 100. Passive layer 116 may be composed of various materials such as silicon, silicon oxide, and/or silicon nitride, and the thickness of this layer is in the range of 0.5 microns to 30 microns for transducers with center frequency from 40 kHz to 20 MHz, and more specifically from 1 micron to 10 microns for transducers with center frequency from 40 kHz to 1 MHz. A conductive metal bottom electrode layer 118 may then be formed on passive layer 116 and a piezoelectric layer 122 may be formed on the bottom electrode layer 118. The electrodes 124 on the front side of the first substrate 100 may include one or more electrodes formed on the top surface of piezoelectric layer 122. An alternating voltage between the electrodes 124 and the bottom electrode layer 118 drives a bending mode oscillation of the PMUTs 102.

Bottom electrode layer 118 may be patterned or not, and may be composed of various metals such as molybdenum (Mo), platinum (Pt), or aluminum (Al), and the thickness of this layer may be from 50 nm to 400 nm and more specifically from 100 nm to 300 nm. A thin dielectric layer 120 may be formed between the passive layer 116 and the bottom electrode layer 118, e.g., by depositing dielectric layer 120 on passive layer 116 and then depositing a layer of metal on dielectric layer 120 to form the bottom electrode 118.

Many materials may be used as dielectric layer 120, including aluminum nitride (AlN), silicon dioxide, and silicon nitride. The typical thickness of the AlN layer is from 10 nm to 150 nm, whereas the silicon dioxide or silicon nitride layer may range from 100 nm to 1000 nm in thickness. When AlN is used as dielectric layer 120 it helps to improve the crystalline orientation of piezoelectric layer 122 when this layer is also composed of AlN. Piezoelectric layer 122 may be composed of various piezoelectric materials including aluminum nitride (AlN), PZT (lead zirconate titanate), zinc oxide (ZnO), KNN ($K_xNa_{1-x}NbO_3$, where x is between 0.06 and 0.7, typically, 0.5) or PMN-PT (lead magnesium niobate-lead titanate). Polymer piezoelectric materials such as polyvinylidene difluoride (PVDF) may be used as piezoelectric layer 122 as well. The thickness of piezoelectric layer 122 is from 250 nm to 3000 nm, and more specifically from 500 nm to 1500 nm. A conductive top electrode metal layer 124 is then deposited. Various metals may be used for top electrode 124, including Al, gold (Au), copper (Cu), and Mo. The thickness of top electrode 124 is from 50 nm to 3000 nm and more specifically from 100 nm to 1000 nm. Electrical contact to the bottom electrode metal 124 may be made, e.g., by etching a via 126 through piezoelectric layer 122. PMUTs 102 are formed by etching tubes 128 through back side 110 of substrate 100 to produce released membranes. When a silicon substrate is employed, this etch may be conducted by deep reactive ion etching (DRIE). The size of the membrane may be in a range from 20 microns to 2000 microns across for transducers operating at frequencies from 40 kHz to 40 MHz and more specifically the membrane size may be from 200 microns to 2000 microns across for transducers operating at frequencies from 60 kHz to 600 kHz. The etch may be performed after thinning the substrate 100 by grinding or other means. The thickness of the substrate 100 may be determined such that the tubes 128 possess an acoustic resonance frequency that is matched to a mechanical resonance frequency of the PMUT. For transducers operating at frequencies from 40 kHz to 1 MHz, the substrate thickness may range from 50 microns to 1500 microns, and more specifically from 50 microns to 850 microns for transducers operating at frequencies from 100 kHz to 500 kHz.

The second substrate 104 contains metal interconnects 114 that are used to make electrical connections to bonding sites 132 electrically connected to the electrodes 124 of the PMUTs 102 on the first substrate 100. The second substrate 104 may be composed of silicon or another material such as glass, ceramic, or a composite laminate material similar to the materials conventionally used for printed circuit boards and multi-chip modules. If a material other than silicon is used, it is desirable that this material should have a coefficient of thermal expansion (CTE) similar to that of silicon (approximately 2.6 ppm/K). Laminate materials may be desirable for the second substrate 104 when a solder ball bonding process is used to bond the two substrates together, however solder ball bonding may also be used to bond substrates made from other materials such as silicon, glass, and ceramic. If silicon is used for the second substrate 104, this substrate may also optionally contain complementary metal oxide semiconductor (CMOS) circuitry for signal processing. The two substrates are bonded together using a conductive bonding layer 106 that provides both a mechanical and electrical connection between conductive layer 124 on the first substrate 100 to a second conductive layer 114 on the second substrate 104. This bonding layer 106 may be formed using a variety of means including solder balls, gold-to-gold thermosonic compression bonding (commonly referred to as GGI, gold-to-gold interconnect), and eutectic metal bonding layers such as aluminum-germanium (Al—Ge), silicon-gold (Si—Au), aluminum-silicon (Al—Si), copper-tin (Cu—Sn), gold-tin (Au—Sn), or gold-indium (Au—In).

As noted above, the two substrates 100 and 104 may be bonded such that a gap 130 remains between the two wafers. The gap may be designed to allow the PMUTs 102 to vibrate without introducing significant squeeze-film damping and is designed such that acoustic reflections off the second substrate 104 do not significantly reduce the sound pressure output from the tube 128. The gap 130 may range from 2 microns to 500 microns and specifically from 25 microns to 400 microns for PMUTs operating at frequencies from 40 kHz to 800 kHz, and more specifically from 50 microns to 400 microns for transducers operating from 100 kHz to 500 kHz. The height of gap 130 may be defined using the thickness of the bonding layer 106 or by using an additional spacer layer to increase the gap in case the bonding layer 106 is too thin. In an alternative embodiment, the bonding layer 106 may be relatively thin (e.g. from 200 nm to 5 microns) and the gap 130 between the PMUT 102 and the second substrate 104 may be increased by etching one or more cavities 131 into substrate 104 opposite the corresponding PMUTs 102 as shown in FIG. 2B. This cavity may be from 10 microns to 200 microns in depth. The gap 130 may be at atmospheric pressure and may be vented so that the gap is not completely sealed and air can pass into the gap 130. Alternatively, for some transducer designs, the gap 130 may be vacuum sealed at a pressure below atmospheric pressure using the conductive bonding layer 106. When the pressure within gap 130 is different from atmospheric pressure, the pressure difference can be used to pre-stress the PMUTs 102 to increase the PMUT's pressure sensitivity (see for example Yamashita, K.; Noda, M.; Yoshizaki, T.; Okuyama, M., "Static deflection control for sensitivity enhancement of piezoelectric ultrasonic microsensors on silicon dioxide diaphragms,"*Proc.* 2009 *IEEE Sensors Conference*, pp. 502, 505, 25-28 Oct. 2009), the entire contents of which are incorporated herein by reference.

Figure 3:
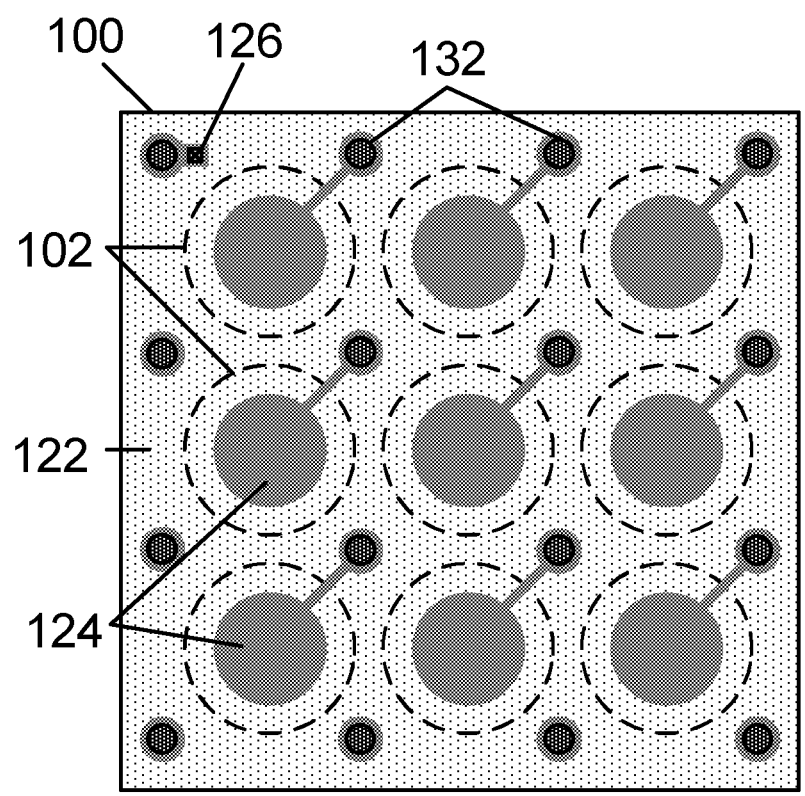
FIG. 3 is a top view of a first substrate containing an array of PMUTs before bonding in accordance with an aspect of the present disclosure.

FIG. 3 shows a top view of the first substrate 100, illustrating a non-limiting example of an implementation where the substrate 100 contains a 3×3 array of 9 PMUTs 102. The piezoelectric layer 122 is shown to cover the top surface of the substrate 100, however it may be partially removed to expose the bottom metal 118 or passive layer 116 or substrate 100. Each PMUT 102 has a top electrode 124 that is electrically connected to a bonding site 132. The top electrodes 124 and bonding sites 132 may be fabricated by patterning a common metal layer formed on the piezoelectric layer 122. One or more vias 126 connect the bottom electrode metal 118 to the top electrode metal 124. The bonding layer 106 may be located on the bonding sites 132 on the first substrate 100 or on the second substrate 104 or both. For example, in the case of metal eutectic bonding, one of the two materials (e.g. Al) may be located on substrate 104 while the second material (e.g. Ge) may be located on substrate 100. In FIG. 2A and FIG. 2B, a single bonding site 132 is located adjacent to each PMUT 102, other embodiments may include annular bond rings that surround or partially surround the PMUT. These bonding sites provide both an electrical connection to the PMUTs and also provide a rigid mechanical connection between substrate 100 and substrate 104, increasing the stiffness of substrate 100 and reducing mechanical cross-talk between neighboring PMUTs 102.

Figure 4:
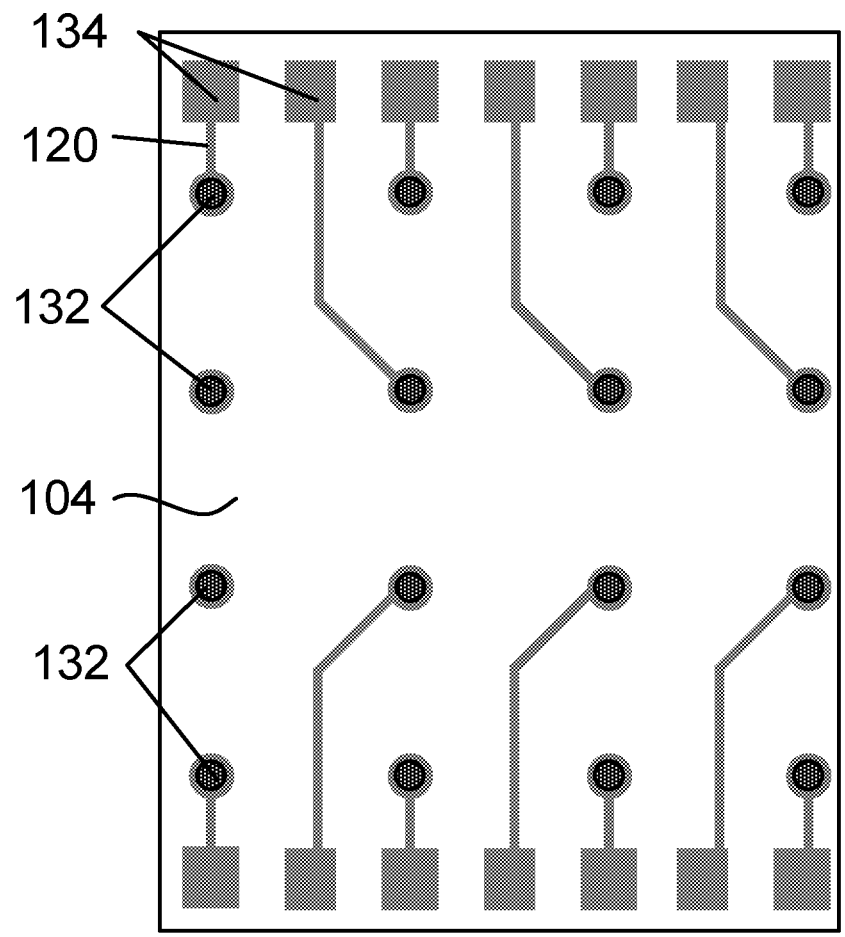
FIG. 4 is a top view of a second substrate containing metallic interconnect before bonding in accordance with an aspect of the present disclosure.

FIG. 4 shows a top view of the second substrate 104 that could be bonded to the top substrate 100 depicted in FIG. 3. The second substrate 104 may contain one or more metal interconnect layers 114 that connect bond pads 134 at the edge of the substrate to the bonding sites 132. The bond pads 134 may also connect to electrical circuitry on substrate 104. The bonding sites 132 are shown to contain the bonding layer 106, however, this layer may also be located on the first substrate 100 as previously described. While the bond pads 134 are shown to be located on the top side of the second substrate 104, in another embodiment these bonding pads 134 may be located on the bottom of the second substrate 104 and appropriate conductive connections are made (e.g.

using through-silicon vias) between the bonding sites 132 on the front surface and the bond pads 134 on the back surface of the second substrate 104.

Figure 5:
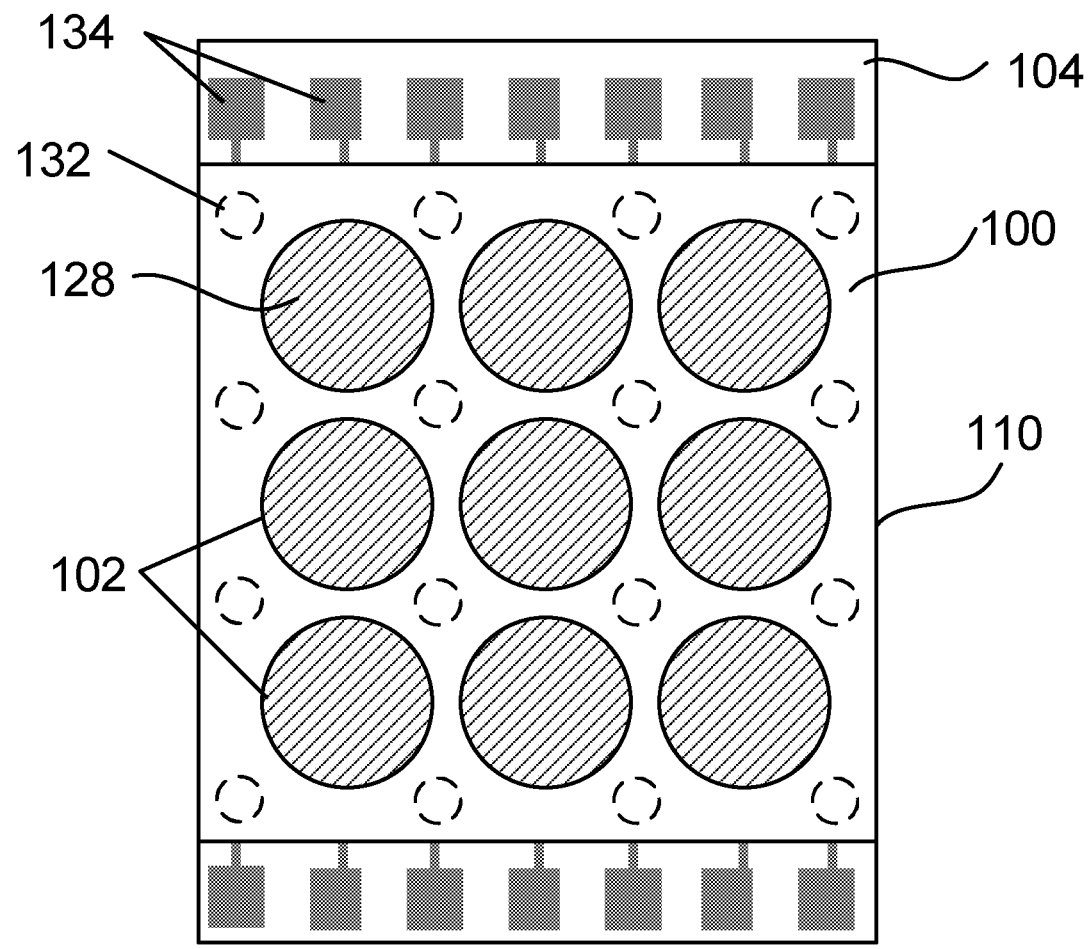
FIG. 5 is a view of the first and second substrates after they have been bonded together in accordance with an aspect of the present disclosure.

FIG. 5 shows a top view of the two substrates after they have been bonded together. The tubes 128 etched into the back side 110 of substrate 100 are facing upwards to expose the PMUTs 102 formed on the front side 108. The first substrate 100 may be diced to a size smaller than the second substrate 104 so that the bond pads 134 at the edge of the second substrate 104 are exposed to allow electrical access to these pads. The dashed circles indicate the locations of bonding sites 132 connecting the two substrates.

Various fabrication processes may be used to bond the first substrate 100 and the second substrate 104. In one embodiment, when the second substrate 134 is a laminate composite material, a flip-chip process is used. The first substrate 100 may be diced into individual chips and solder balls 106 may be placed onto the bonding sites 132 on the second substrate 104. The chips from the first substrate may then be placed onto the second substrate 104 and heat may be applied to reflow the solder balls 106. Alternatively, when gold-to-gold thermosonic (GGI) bonding is used, the bonding sites 132 on the first substrate 100 may be coated with a layer of gold and gold stud bumps 106 may then be applied to the second substrate 104 using either a gold stud bumping machine or electroless nickel gold plated bumps 106 may be applied to the second substrate 104 using electroplating, after which a thermosonic flip-chip bonding machine may be used to bond the first substrate 100 to the second substrate 104.

In a second embodiment, in which both the first substrate 100 and the second substrate 104 are wafers of equal size, the bonding is performed at wafer level. All fabrication on the two substrates is completed before bonding the two substrates together. The substrates are bonded using an appropriate combination of heat and pressure. After bonding, the final step in this process is to dice the wafers to produce individual dice containing one or more PMUTs.

In a third embodiment, in which both the first substrate 100 and the second substrate 104 are wafers of equal size, the bonding is performed at wafer level after all processing is completed on the front sides of the two wafers, but before the tubes 128 are etched into the first substrate 100. In this process, the two wafers are bonded together, after which the first substrate 100 may be thinned by etching or mechanical grinding to a desired thickness. Then, the tubes 128 are lithographically patterned and etched into the back side 110 of the first substrate 100. This second process may be advantageous when it is desired to thin the first substrate to a thickness below 300 microns before etching the tubes 128, to eliminate difficulties associated with handling, etching and processing a thin wafer.

All cited references are incorporated herein by reference in their entirety. In addition to any other claims, the applicant(s)/inventor(s) claim each and every embodiment of the invention described herein, as well as any aspect, component, or element of any embodiment described herein, and any combination of aspects, components or elements of any embodiment described herein.

The appended claims are not to be interpreted as including means-plus-function limitations, unless such a limitation is explicitly recited in a given claim using the phrase "means for." Any element in a claim that does not explicitly state "means for" performing a specified function, is not to be interpreted as a "means" or "step" clause as specified in 35 USC § 112(f). In particular, the use of "step of" in the claims herein is not intended to invoke the provisions of 35 USC § 112(f).

What is claimed is:
1. A device, comprising:
a first substrate containing one or more piezoelectric micromachined ultrasound transducers (PMUTs) that include one or more electrodes at a front side of the first substrate, wherein one or more openings formed through the first substrate from a front side thereof to a backside thereof are configured to act as resonant tubes for the one or more PMUTs;
a second substrate having one or more electrical connections on a surface thereof, wherein the first substrate is bonded with the front side facing the second substrate such that the back side of the first substrate faces away from the second substrate, wherein the first and second substrates are bonded such that there is a gap between the PMUTs on the first substrate and the surface of the second substrate, and wherein the one or more electrodes on the front side of the first substrate electrically contact the electrical connections on the surface of the second substrate independent of any connections through the first substrate from the front side of the first substrate to the back side of the first substrate.

2. The device of claim 1, wherein the first substrate is bonded to a second substrate using a conductive bonding layer that provides both a mechanical connection between the first and second substrates and an electrical connection between the one or more electrodes on the front side of the first substrate and the one or more corresponding electrical connections on the surface of the second substrate.

3. The device of claim 2, wherein the bonding layer is formed using solder balls, gold-to-gold compression bonding, or a eutectic metal bonding layer.

4. The device of claim 2, wherein the bonding layer is formed using a eutectic metal bonding layer.

5. The device of claim 4, wherein the eutectic metal bonding layer is aluminum-germanium (Al—Ge), silicon-gold (Si—Au), aluminum silicon (Al—Si), copper-tin (Cu—Sn), gold-tin (Au—Sn), or gold-indium (Au—In).

6. The device of claim 1, wherein the one or more PMUTs are formed from a plurality of layers formed onto the front side of the first substrate.

7. The device of claim 1, wherein the first substrate includes one or more openings therethrough corresponding to the one or more PMUTs.

8. The device of claim 7, wherein a thickness of the first substrate is such that an acoustic resonance frequency of the openings matches a mechanical resonance frequency of vibration of the PMUTs.

9. The device of claim 1, wherein a thickness of gap is large enough to allow the PMUTs room to vibrate without introducing significant squeeze-film damping.

10. The device of claim 1, wherein a thickness of gap is designed such that acoustic reflections within the cavity formed between the first and second substrate do not significantly reduce sound pressure output from the PMUTs.

11. The device of claim 1, wherein the gap between the first and second substrates is vented so that the gap is not completely sealed from an atmosphere external to the gap.

12. The device of claim 1, wherein the gap is sealed and an atmospheric pressure within the gap is below an atmospheric pressure outside the gap.

13. The device of claim 1, wherein the first substrate is made of silicon.

14. The device of claim 1, wherein the one or more PMUTs include a passive layer formed onto the front side of the substrate.

15. The device of claim 14, wherein the one or more electrodes on the front side of the first substrate include a conductive metal bottom electrode layer formed on the passive layer and a piezoelectric layer formed on the bottom electrode layer.

16. The device of claim 15, wherein the one or more electrodes on the front side of the first substrate include one or more electrodes formed on the piezoelectric layer.

17. The device of claim 15, wherein the bottom electrode layer is patterned.

18. The device of claim 15, further comprising a thin dielectric layer formed between the passive layer and the bottom electrode layer.

19. The device of claim 18, wherein the thin dielectric layer is made of aluminum nitride (AlN), silicon nitride, or silicon dioxide.

20. The device of claim 18, wherein the thin dielectric layer and the piezoelectric layer are made of aluminum nitride.

21. The device of claim 15, wherein the piezoelectric layer includes one or more materials selected from the group of aluminum nitride (AlN), lead zirconate titanate (PZT), zinc oxide (ZnO), potassium sodium niobate ($K_xNa_{1-x}NbO_3$, where x is between 0.06 and 0.7, or KNN) or lead magnesium niobate-lead titanate (PMN-PT) or a polymer piezoelectric material such as polyvinylidene difluoride (PVDF).

22. The device of claim 1, wherein the second substrate is composed of silicon.

23. The device of claim 1, wherein the second substrate is composed of glass, ceramic, or a composite laminate material.

24. The device of claim 1, wherein the one or more electrodes on the front side of the first substrate include one or more top electrodes electrically connected to one or more corresponding bonding sites on the front side of the first substrate.

25. The device of claim 24 wherein the one or more top electrodes and the one or more corresponding bonding sites are formed from a common metal layer.

26. The device of claim 24, wherein the one or more electrical connections on the surface of the second substrate include one or more bonding sites on the second substrate aligned with the one or more corresponding bonding sites on the first substrate.

27. The device of claim 26, wherein the one or more electrical connections on the surface of the second substrate include one or more bond pads at an edge of the second substrate.

28. The device of claim 27, wherein the one or more electrical connections on the surface of the second substrate include one or more metal interconnect layers that electrically connect the bond pads at the edge of the second substrate to the one or more bonding sites on the second substrate.

29. A method of making a PMUT device, comprising:
bonding a first substrate containing one or more piezoelectric micromachined ultrasound transducers (PMUTs) that include one or more electrodes at a front side of the first substrate to a second substrate having one or more electrical connections on a surface thereof, wherein one or more openings formed through the first substrate from a front side thereof to a backside thereof are configured to act as resonant tubes for the one or more PMUTs, wherein the first substrate is bonded with its front side facing the second substrate such that a back side of the first substrate faces away from the second substrate, wherein the first and second substrates are bonded such that there is a gap between the PMUTs on the first substrate and the surface of the second substrate, and wherein the electrodes on the front side of the first substrate electrically contact the one or more electrical connections on the surface of the second substrate independent of any connections through the first substrate from the front side of the first substrate to the back side of the first substrate.

30. The method of claim 29, wherein the first substrate is bonded to the second substrate using a conductive bonding layer that provides both a mechanical connection between the first and second substrates and an electrical connection between the one or more electrodes on the front side of the first substrate and the one or more corresponding electrical connections on the surface of the second substrate.

31. The method of claim 30, wherein the bonding layer is formed using solder balls, gold-to-gold compression bonding, or a eutectic metal bonding layer.

32. The method of claim 30, wherein the bonding layer is formed using a eutectic metal bonding layer.

33. The method of claim 32, wherein the eutectic metal bonding layer is aluminum-germanium (Al—Ge), silicon-gold (Si—Au), aluminum silicon (Al—Si), copper-tin (Cu—Sn), gold-tin (Au—Sn), or gold-indium (Au—In).

34. The method of claim 29, wherein the first substrate is bonded to the second substrate using a flip-chip process in which the second substrate is diced into individual chips before bonding the chips to the first substrate.

35. The method of claim 34, wherein the second substrate includes a laminate composite material.

36. The method of claim 29, wherein the first wafer is bonded to the second wafer before dicing the first or second substrate.

37. The method of claim 36, wherein fabrication on the first and second substrates is completed before bonding the first and second substrates together.

38. The method of claim 36, wherein the first substrate and the second substrate of equal size.

39. The method of claim 36, further comprising forming one or more openings through the first substrate at locations corresponding to the one or more PMUT devices.

40. The method of claim 39, wherein the first substrate is bonded to the second substrate after processing is completed on the front sides of the first and second substrates but before the tubes are formed through the first substrate.

41. The method of claim 40, further comprising thinning the first substrate to a thickness below 300 microns before forming the tubes.

* * * * *